United States Patent [19]
Ono

[11] Patent Number: 5,477,200
[45] Date of Patent: Dec. 19, 1995

[54] VARIABLE ATTENUATOR

[75] Inventor: Tomohiko Ono, Kamakura, Japan

[73] Assignee: Mitsubishi Denki Kabushiki Kaisha, Tokyo, Japan

[21] Appl. No.: 346,580

[22] Filed: Nov. 16, 1994

[30]     Foreign Application Priority Data

Dec. 27, 1993   [JP]   Japan .................................. 5-332666

[51] Int. Cl.$^6$ ........................................................ H01P 1/22
[52] U.S. Cl. ............................................ 333/81 R; 333/81 A
[58] Field of Search .................................... 333/109, 116, 333/81 R, 81 A

[56]                References Cited

U.S. PATENT DOCUMENTS

| 4,216,445 | 8/1980 | Abajian | 333/81 R |
| 4,701,724 | 10/1987 | Martin | 333/109 X |
| 5,204,643 | 4/1993 | Verronen | 333/81 R |

FOREIGN PATENT DOCUMENTS 61-139110  6/1986  Japan .
61-172403  8/1986  Japan .
102602     5/1987  Japan .................................... 333/81 R

OTHER PUBLICATIONS

Arvind K. Sharma, "Solid–State Control Devices: State of the Art" 1989 State of The Art Reference, pp. 95–112 Microwave Journal.

*Primary Examiner*—Paul Gensler
*Attorney, Agent, or Firm*—Wolf, Greenfield & Sacks

[57]                ABSTRACT

A current bias-type variable attenuator. Two PIN diodes are disposed in series to each other and in the forward direction on a bias current path. When a bias voltage is applied to a bias terminal, d.c. current flows in the order of a combination output port, an in-phase output port, a first PIN diode, an input port, a 900°—delayed phase output port, and a second PIN diode, or in the order of the combination output port, the in-phase output port, the first PIN diode, the second PIN diode, the 900°—delayed phase output port, and the input port. Since d.c. current flowing through the first PIN diode and d.c. current flowing through the second PIN diode have an equal value, an RF resistance of the first PIN diode and that of the second PIN diode are balanced.

42 Claims, 4 Drawing Sheets

VARIABLE ATTENUATOR

BACKGROUND OF THE INVENTION a) Field of the Invention

This invention relates to an attenuator for attenuating a microwave signal, and particularly to a variable attenuator which can vary attenuation by means of a control signal.

b) Description of the Prior Art

A microwave attenuator may be implemented as a fixed attenuator or a variable attenuator. A typical example of the variable attenuator is a reflection attenuator. The reflection attenuator can consist of a 4-port coupler, PIN diodes, and dummy loads.

Figure 9:
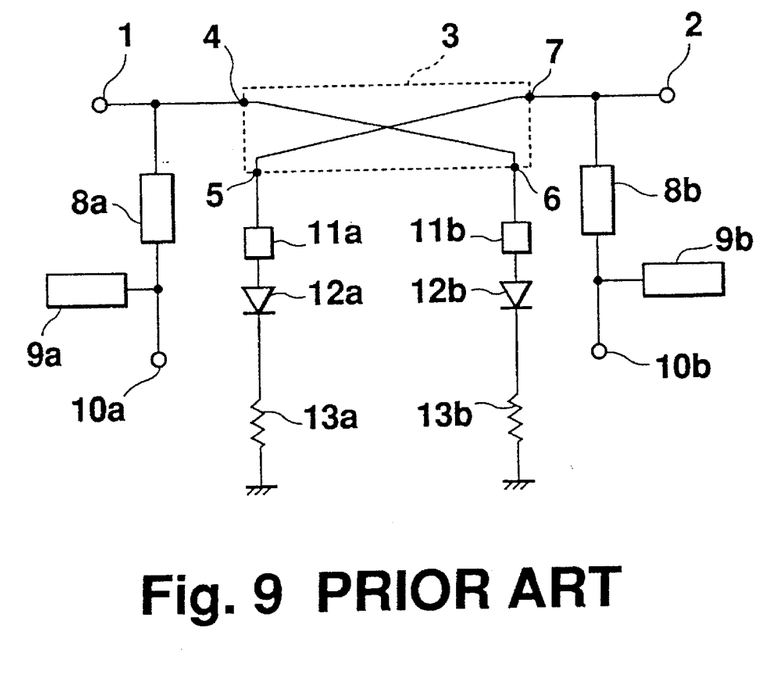
FIG. 9 is a topological sketch of prior art.

FIG. 9 shows the construction of a reflection attenuator according to one prior art. This prior art uses a 4-port coupler (3) which has four ports (4 to 7). The port 4 and the port 5 are in radio frequency coupling, and a microwave signal inputted from the port 4 appears at the port 5 in an in-phase half amplitude. Similarly, the port 6 and the port 7 are in radio frequency coupling, and a microwave signal inputted from the port 6 appears at the port 7 in an in-phase half amplitude. The port 4 is connected to the port 6 by a line, and a microwave signal which is inputted in the port 4 appears at the port 6 in 90°—delayed half amplitude. And, the port 5 is connected to the port 7 by a line, and a microwave signal which is inputted in the port 5 appears at the port 7 in a 90°—delayed phase half amplitude. These relations constitute even when input and output are exchanged. Specifically, the 4-port coupler 3 is a quadrature hybrid coupler or a 3-dB range coupler, and the ports 4 to 7 are an input port, an in-phase output port, a 90°—delayed phase output port and a 90°—delayed phase combination output port, respectively.

In FIG. 9, the port 4 is connected to a signal input terminal 1, and the port 7 to a signal output terminal 2, respectively. A microwave signal which is inputted in the signal input terminal 1 appears at the port 5 in an in-phase half amplitude and at the port 6 in a 90°—delayed phase half amplitude. The port 5 is connected to a termination circuit in which a transmission line 11a, a PIN diode 12a, and a dummy load 13a are connected in series in this order. Similarly, the port 6 is connected to a termination circuit in which a transmission line 11b, a PIN diode 12b, and a dummy load 13b are connected in series.

The transmission lines 11a and 11b have an impedance converting function. In this case, a characteristic impedance of the 4-port coupler 3 after the impedance conversion made by the transmission lines 11a and 11b is assumed to be Z0 as the matched impedance of the transmission line. Since the PIN diodes 12a and 12b function as variable radio frequency resistive elements, when synthesized resistance Z1a of the dummy load 13a and the PIN diode 12a is equal to Z0, the port 5 falls under a reflectionless termination state. Similarly, when synthesized resistance Z1b of the dummy load 13b and the PIN diode 12b is equal to Z0, the port 6 falls under a reflectionless termination state.

As described above, the signal which appears at the port 5 appears at the port 7 in a 90°—delayed phase half amplitude, and the signal which appears at the port 6 appears at the port 7 in an in-phase half amplitude. Therefore, the signal appearing at the port 7 is a combined signal of a reflection signal by the termination circuit connected to the port 5 among the signals inputted from the port 4, and a reflection signal by the termination circuit connected to the port 6 among the signals inputted from the port 4. These reflection signals are in-phase with each other because they are opposite relative to the signal inputted in the port 4. Therefore, the combination at the port 7 is an in-phase combination. When both Z1a and Z1b are equal to Z0, both the ports 5 and 6 are subjected to the reflectionless termination, and no reflection signal appears at the port 7 (a state of infinite attenuation). On the other hand, when both Z1a and Z1b are substantially infinite, both the ports 5 and 6 fall under a total reflection state, and the maximum reflection signal appears at the port 7 (a state of minimum attenuation).

Therefore, if Z1a and Z1b could be varied successively in the range of Z0 to infinity, the attenuation of the signal outputted from the signal output terminal 2 with respect to the signal inputted from the signal input terminal 1 can be ideally controlled successively in the range of 0 to infinity. As a means therefor, the prior art provides the PIN diodes 12a and 12b and a bias control circuit.

As shown in FIG. 9, the signal input terminal 1 and the signal output terminal 2 have bias terminals 10a and 10b connected, respectively. Since the coupling of the ports 4 and 5 prevents a d.c. voltage, the d.c. voltage which is applied to the bias terminal 10a is applied to the anode of the PIN diode 12b. Similarly, since the coupling of the ports 5 and 7 prevents a d.c. voltage, the d.c. voltage which is applied to the bias terminal 10b is added to the anode of the PIN diode 12a. Accordingly, the resistance values of the PIN diodes 12a and 12b are determined by the d.c. voltage (bias voltage) which is applied to the terminal 10b or 10a, respectively. In other words, the successive variation of the bias voltage which is applied to the terminals 10a and 10b can successively vary Z1a and Z1b in the range of Z0 to infinity. Thus, the attenuation can be successively controlled in the range of 0 to infinity.

Furthermore, quarter wavelength lines 8a and 8b are respectively connected between the signal input terminal 1 and the bias terminal 10a and between the signal output terminal 2 and the bias terminal 10b. To the bias terminals 10a and 10b, quarter wavelength open stubs 9a and 9b which are quarter wavelength lines with one end open are connected, respectively. When the quarter wavelength open stubs 9a and 9b are observed from the bias terminals 10a and 10b, impedance thereof becomes 0. When this impedance is observed from the signal input terminal 1 or the signal output terminal 2, it is seen to be infinite because of the quarter wavelength lines 8a and 8b which are present between the signal input terminal 1 and the bias terminal 10a and between the signal output terminal 2 and between the bias terminal 10b.

Therefore, regardless of the connection of the bias terminals 10a and 10b to the signal input terminal 1 and the signal output terminal 2, respectively, for a signal which has a relatively high frequency and therefore a relatively short wavelength of the same length as that of an electrical length of each quarter wavelength line or open stub, the bias terminals 10a and 10b fall in a state not visibly existing. Thus, the quarter wavelength lines 8a and 8b function in the same way as an inductance in a Radio-frequency circuit, and the quarter wavelength open stubs 9a and 9b function in the same way as a capacitance, so that a circuit consisting of the quarter wavelength line 8a and the quarter wavelength open stub 9a and a circuit consisting of the quarter wavelength line 8b and the quarter wavelength open stub 9b can be understood by the analogy with a resonance circuit in a Radio-frequency circuit. These circuits are called RF chokes.

For accurate functioning of a variable attenuator having the circuit configuration as shown in FIG. 9, the resistance values of the PIN diodes 12a and 12b must be balanced accurately. Therefore, bias voltages which are added to the PIN diodes 12a and 12b must be also balanced accurately. But, it is difficult to secure such a balance in the construction as the bias voltages are separately applied to the PIN diodes 12a and 12b as in FIG. 9. Furthermore, the PIN diodes 12a and 12b generally have a stray capacity or a stray inductance.

Because the demands for securing balanced bias voltages of the PIN diodes 12a and 12b cannot be fully met, the attenuation cannot be fully and accurately controlled heretofore. Therefore, the variable attenuator can not avoid suffering from poor I/O characteristics, reflection characteristics, and frequency characteristics. And, attenuation characteristics also deteriorate when affected by a stray capacity or a stray inductance.

SUMMARY OF THE INVENTION

The first object of this invention is to provide a variable attenuator which can accurately and sufficiently control attenuation.

The second object of this invention is to satisfactorily balance control signals (e.g. bias voltage) which are given to variable radio frequency resistive elements (e.g. PIN diodes) without adversely affecting the characteristics of a variable attenuator, and additionally to balance resistance values of the variable radio frequency resistive elements.

The third object of this invention is to realize a variable attenuator which is not affected by stray capacitance or stray inductance of the variable radio frequency resistive element.

The variable attenuator according to this invention is provided with the following:

a) a coupler having first to fourth ports: wherein when a radio frequency signal is inputted in the first port, a radio frequency signal which has an in-phase from the radio frequency signal inputted in the first port appears at the second port, and a radio frequency signal which has a 90°—delayed phase of the radio frequency signal inputted in the first port appears at the third port; and at the fourth port, a radio frequency signal which has a 90°—delayed phase of the radio frequency signal appeared at the second port appears and a radio frequency signal which has an in-phase from the radio frequency signal appeared at the third port appears;

b) a single d.c. current path through which d.c. current according to the required attenuation flows; and c) first and second variable radio frequency resistive elements which are disposed on the d.c. current path, and making up at least parts of the termination impedances of the second and third ports, respectively, by producing resistances of a value corresponding to a value of the d.c. current.

In this invention, a radio frequency signal is inputted through the first port, namely an input port, to the coupler. Then, a signal which has an in-phase from the radio frequency signal inputted in the input port appears at the second port, namely an in-phase output port, and a 90°—delayed phase signal appears at the third port, namely a 90°—delayed phase output port, of the coupler. The radio frequency signal which has appeared at the in-phase output port without phase-delay and appears at the fourth port with 90° delay, namely a combination output port of the coupler, and the radio frequency signal which has appeared at the 90°—delayed phase output port is phase-inverted and appears at the combination output port. Specifically, a radio frequency signal which is obtained by combining the radio frequency signal obtained by the phase-inversion of the radio frequency signal which is inputted from the input port by coupling the input port and the in-phase output port and a radio frequency signal obtained by the phase-inversion of the radio frequency signal which is inputted from the input port by coupling the 90°—delayed phase output port and the combination output port, is outputted from the combination output port. This combination is called an in-phase combination because the signals to be combined are in-phases.

In this invention, the in-phase output port is terminated by a termination impedance containing radio frequency resistance components of a first variable radio frequency resistive element such as a PIN diode, and the 90°—delayed phase output port is terminated by a termination impedance containing radio frequency resistance components of a second variable radio frequency resistive element such as an PIN diode. Therefore, the control of the radio frequency resistance components of the first and second variable radio frequency resistive elements can increase or decrease the reflection from the in-phase output port or the 90°—delayed phase output port. An increase of reflection from the in-phase output port and the 90°—delayed phase output port increases output from the combination output port, and a decrease of reflection from the in-phase output port and the 90°—delayed phase output port decreases output from the combination output port. The variable attenuator which can variably control attenuation successively based on the above principle is called a reflection attenuator.

The first and second variable radio frequency resistive elements produce resistance (radio frequency resistance components) of a value corresponding to a value of the supplied d.c. current. This invention is principally characterized by the fact that the first and second variable radio frequency resistive elements are driven by an equal current. Specifically, the first and second variable radio frequency resistive elements are disposed on a certain single d.c. current path. When a PIN diode is used as the first variable radio frequency resistive element, first and second PIN diodes are connected in the forward direction along the d.c. current path.

Generally, the same current flows through two circuit elements which are disposed on the same d.c. current path. In this invention, the same current flows through the first and second variable radio frequency resistive elements and, as a result, the radio frequency resistance components of the first and second variable radio frequency resistive elements have the same value. It does not happen that different currents flow through the first and second variable radio frequency resistive elements, resulting in an unbalanced radio frequency resistance component as in the case of voltage driving.

Accordingly, this invention does not cause unbalanced radio frequency resistance components of the first and second variable radio frequency resistive elements, and besides does not cause an unbalance of the termination impedance of the in-phase output port and the termination impedance of the 90°—delayed phase output port. As a result, attenuation can be accurately controlled to a sufficient degree. In this case, no adverse effect is caused to the variable attenuator characteristics.

To the above input port and the combination output port, a signal input terminal and a signal output terminal are connected, respectively. When a radio frequency signal to be attenuated is inputted to the signal input terminal, the attenuated radio frequency signal is outputted from the signal output terminal. The termination circuit of the in-phase output port generally consists of a line (may be provided with an impedance converting function) for transmitting the radio frequency signal appeared at the in-phase output port to the first variable radio frequency resistive element and a dummy load which forms at least a part of the termination impedance, in addition to the first variable radio frequency resistive element. The termination circuit of the 90°—delayed phase output port generally consists of a line (may be provided with an impedance converting function) for transmitting the radio frequency signal appeared at the 90°—delayed phase output port to the second variable radio frequency resistive element and a dummy load which forms at least a part of the termination impedance, in addition to the second variable radio frequency resistive element.

First, the d.c. current path of this invention has a structure in that polarity of the first variable radio frequency resistive element which is observed from the in-phase output port, and polarity of the second variable radio frequency resistive element which is observed from the 90°—delayed phase output port, are opposite (reversed polarity connection to the coupler). For example, when observed in the direction that d.c. current flows, a path consisting of the terminal (bias terminal) for supplying the d.c. current →the combination output port→(coupler inside)→the in-phase output port→ the first variable radio frequency resistive element→the second variable radio frequency resistive element→the 90°—delayed phase output port→ (coupler inside)→the input port→the ground can be adopted. When this path is adopted, there are required: a circuit which makes a d.c. connection of the terminal and the combination output port while isolating a radio frequency signal (hereafter referred to as the first circuit); a circuit which makes d.c. isolation of the first and second variable radio frequency resistive elements from the ground while making a radio frequency connection and also makes a d.c. connection of the first variable radio frequency resistive element and the second variable radio frequency resistive element while isolating a radio frequency signal (hereinafter referred to as the second circuit); and a circuit which makes a d.c. connection of the first port and the ground while isolating a radio frequency signal (hereinafter referred to as the third circuit).

The first circuit can be realized by inserting a quarter wavelength line between the bias terminal and the combination output port and connecting another quarter wavelength line with one end open to the bias terminal. The second circuit can be realized by inserting grounding capacitors between the first variable radio frequency resistive element and the ground and between the second variable radio frequency resistive element and the ground, respectively, and connecting the non-grounded ends of both the grounding capacitors by a connection line. The third circuit can be realized by inserting a quarter wavelength line between the input line and the ground and connecting another quarter wavelength line with one end open to the above quarter wavelength line.

Second, the d.c. current path of this invention has a structure in that polarity of the first variable radio frequency resistive element which is observed from the in-phase output port and the polarity of the second variable radio frequency resistive element which is observed from the 90°—delayed phase output port are the same (same polarity connection to the coupler). In particular, when the first and second PIN diodes which contain stray components distributed asymmetrically with respect to an RF resistance are used as the first and second variable radio frequency resistive elements, the same polarity connection to the coupler prevents the effects of the stray capacitance and the stray inductance of the variable radio frequency resistive element. Thus, it is effective to secure the impedance balance.

In this type of construction, when observed in the direction that d.c. current flows, the d.c. current path can have a flow of the bias terminal→the first circuit→the combination output port→(coupler inside)→the in-phase output port→ the first variable radio frequency resistive element→the input port→(coupler inside)→the 90°—delayed phase output port→the second variable radio frequency resistive element→the ground. To adopt this construction, in addition to the first circuit, there are needed a circuit which makes a radio frequency connection of the first variable radio frequency resistive element and the ground while making a d.c. isolation and makes a d.c. connection of the first variable radio frequency resistive element and the input port while isolating a radio frequency signal (hereinafter referred to as the fourth circuit); and a circuit which makes a d.c. connection of the second variable radio frequency resistive element and the ground while making a d.c. isolation of the second variable radio frequency resistive element and the bias terminal (hereinafter referred to as the fifth circuit).

The first circuit is sufficient in the structure described above. The fourth circuit can be structured by disposing a grounding capacitor between the first variable radio frequency resistive element and the ground, connecting a quarter wavelength line to the first variable radio frequency resistive element, connecting another quarter wavelength line with one end open to the above quarter wavelength line, and disposing a further quarter wavelength line between the quarter wavelength line with one end open and the input port. The fifth circuit can be structured by connecting a quarter wavelength line to the bias terminal, and disposing a coupling capacitor between the second variable radio frequency resistive element and the quarter wavelength line.

For the same polarity connection to the coupler, the fourth circuit may be structured by disposing a grounding capacitor between the first variable radio frequency resistive element and the ground, connecting a quarter wavelength line with one end open to one end of the grounding capacitor, and disposing another quarter wavelength line between the above quarter wavelength line and the input port.

To adopt the above same polarity connection to the coupler, it is preferable to additionally dispose a dumping resistance in order to suppress resonance sharpness of the first and second variable radio frequency resistive elements.

DETAILED DESCRIPTION OF THE PREFERRED EMBODIMENTS

Now, preferred embodiments of the invention will be described with reference to the drawings. As to the structure which is the same as or not the same as but similar to that of the prior art of FIG. 9, the same reference numerals will be used and their description will be omitted. The same is also applied to the structure which is common to respective embodiments.

a) First embodiment

Figure 1:
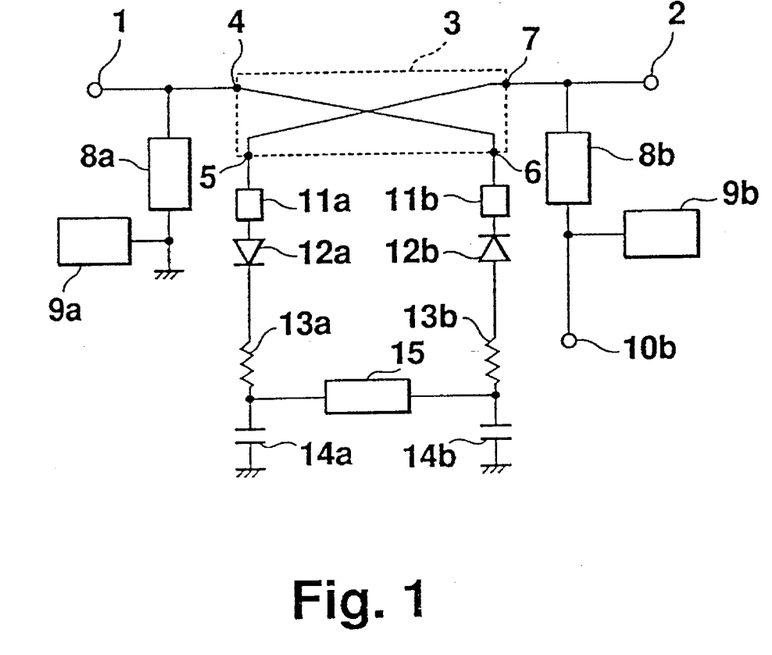
FIG. 1 is a topological sketch of the first embodiment of the invention.

FIG. 1 shows the structure of a variable attenuator according to the first embodiment of the invention. In this embodiment, the anode and the cathode of the PIN diode 12a are connected to the line 11a and the dummy load 13a, respectively, while the anode and the cathode of the PIN diode 12b are connected to the dummy load 13b and the line 11b, respectively. In other words, the PIN diode 12b has its polarity reversed from the prior art.

Grounding capacitors 14a and 14b are disposed between the dummy loads 13a, 13b and the grounds, respectively. The grounding capacitors 14a and 14b insulate a d.c. signal and short in a radio frequency range between the dummy loads 13a, 13b and the grounds. Furthermore, a connection line 15 connects the connecting point of the dummy load 13a and the grounding capacitor 14a to the connecting point of the dummy load 13b and the grounding capacitor 14b. Also, a position where a bias terminal 10a is disposed in the prior art is now grounded.

Accordingly, this embodiment configures only one d.c. current path consisting of the bias terminal 10b→the line 8b→the port 7→the port 5→the line 11a→the PIN diode 12a→the dummy load 13a→the connection line 15→ the dummy load 13b→the PIN diode 12b→the line 11b→the port 6→the port 4→the line 8a→the ground. Since the PIN diodes 12a and 12b are present in the same polarity along this current path, the same current flows through the PIN diodes 12a and 12b, which have the same resistance value as a result. Thus, in the embodiment, the PIN diodes 12a and 12b have their resistance values preferably balanced, making it possible to accurately control attenuation. A termination circuit which is connected to the ports 5 and 6 is the same equivalent circuit as in the prior art in terms of a radio frequency, so that it is noted that the termination function does not change.

Figure 2:
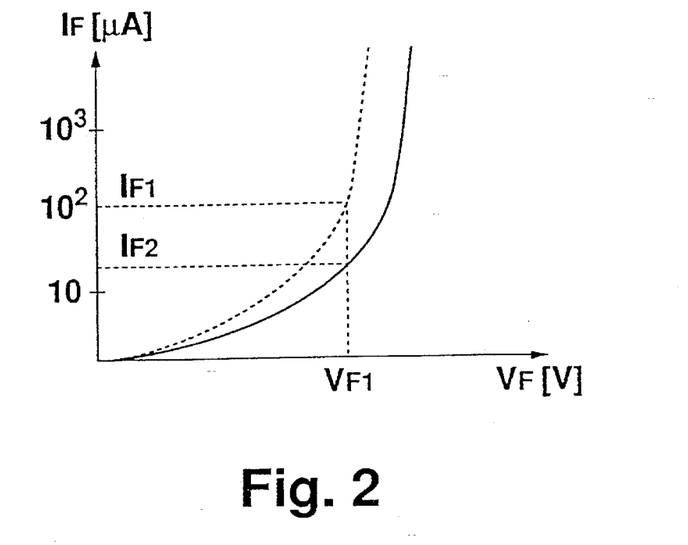
FIG. 2 is a graph showing the characteristics of forward voltage-to-forward current of a PIN diode.
Figure 3:
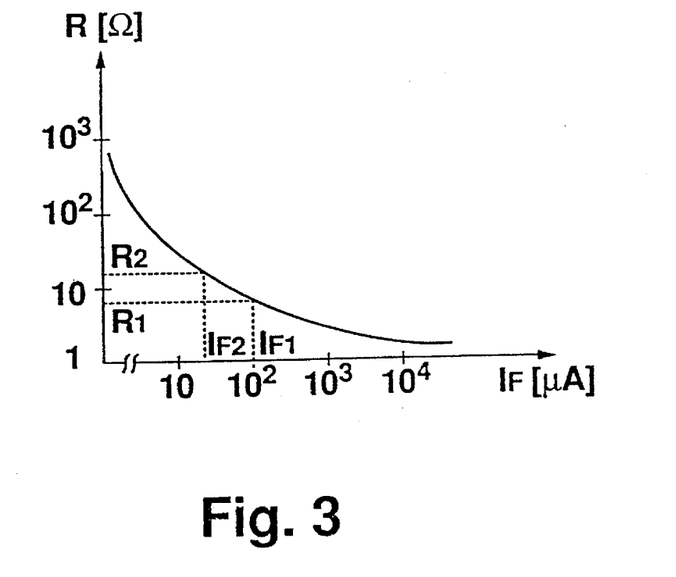
FIG. 3 is a graph showing the characteristics of forward current-to-RF resistance of a PIN diode.

FIG. 2 shows forward direction current-voltage characteristics of the PIN diodes 12a and 12b. It is assumed here that the two PIN diodes have different characteristics i.e. the PIN diode 12a has characteristics indicated by a broken line and the PIN diode 12b has characteristics indicated by a solid line. Then, the control by a bias voltage VF1 in the same manner as in the prior art results in that current IF1 flowing through the PIN diode 12a and current IF2 flowing through the PIN diode 12b have different values. Since a PIN diode has the current resistance characteristics as shown in FIG. 3, the PIN diodes 12a and 12b have different resistance values R1 and R2 to each other. This results in inducing the unbalance between the reflections at the port 5 and the port 6.

On the other hand, in this embodiment, the same current flows through the PIN diodes 12a and 12b without exception, resulting in the same resistance value. Therefore, this embodiment provides the appropriately balanced resistance values of the PIN diodes 12a and 12b, making it possible to accurately control attenuation, and does not raise any problem in reflection properties and others.

b) Second embodiment

Figure 4:
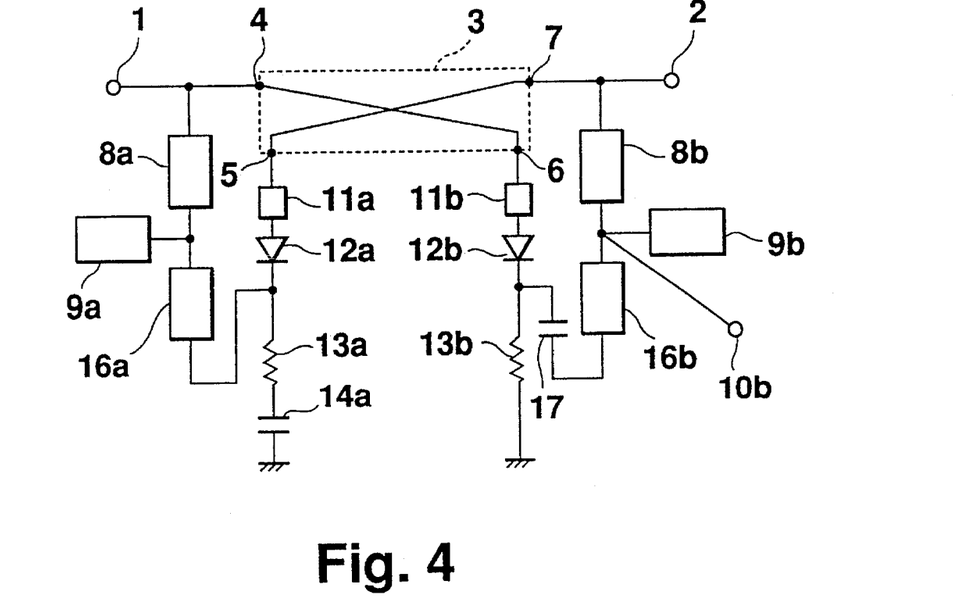
FIG. 4 is a topological sketch of the second embodiment of the invention.

FIG. 4 shows the structure of a variable attenuator according to the second embodiment of the invention. In this embodiment, the PIN diode 12b has the same polarity as does the prior art. The cathodes of the PIN diodes 12a and 12b are connected each to one end of quarter wavelength lines 16a and 16b, respectively. The other ends of the quarter wavelength lines 16a and 16b are connected to a connection point of the quarter wavelength line 8a and the quarter wavelength open stub 9a and to a connection point of the quarter wavelength line 8b and the quarter wavelength open stub 9b. Among the grounding capacitors disposed in the first embodiment, 14b is not disposed in this embodiment. The cathode of the PIN diode 12b is connected to one end of the quarter wavelength line 16b through a coupling capacitor 17.

Therefore, this embodiment forms one d.c. current path consisting of the bias terminal 10b→the line 8b→the port 7→the port 5→the line 11a→the PIN diode 12a→the line 16a→the line 8a→the port 4→the port 6→the line 11b→the PIN diode 12b→the dummy load 13b→the ground. Since the PIN diodes 12a and 12b are present in the same polarity along this current path, the same current flows through the PIN diodes 12a and 12b, and they have the same resistance value. Thus, this embodiment provides the appropriately balanced resistance values of the PIN diodes 12a and 12b, making it possible to accurately control attenuation, and does not raise any problem in reflection properties and others.

As in the case of the first embodiment, the termination circuits connected to the ports 5 and 6 are the same equivalent circuits as in the prior art in terms of a radio frequency, so that it is noted that the termination function does not change. And, when observed from the cathode of the PIN diode 12a or 12b, the impedances of the quarter wavelength lines 16a and 16b becomes a high impedance at a radio frequency because the quarter wavelength open stub 9a or 9b is disposed. Therefore, there is no leakage of an RF signal from the cathode of the PIN diode 12a or 12b to the quarter wavelength line 16a or 16b. An electrostatic capacity of the coupling capacitor 17 is set up to establish the above impedance relationship at a frequency of the signal subject to attenuation.

This embodiment, as compared with the first embodiment, has an advantage of reducing the effect of the unbalanced stray inductances of the PIN diodes 12a and 12b.

Figure 5:
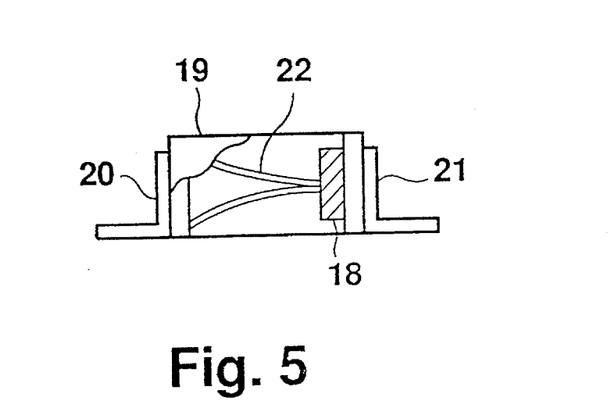
FIG. 5 is a diagram showing the internal structure of a PIN diode.

As shown in FIG. 5, the PIN diodes 12a and 12b may have the structure in that a diode chip 18 having a surface electrode (not shown) is accommodated into a package 19, and the diode chip 18 is connected to an external circuit through terminals 20 and 21 which are disposed outside of the package 19. Realization of this structure needs to connect the surface electrode of the diode chip 18 to the terminal 21, and to dispose a wire 22 to connect the diode chip 18 to the terminal 20. This wire 22 is expressed as a stray inductance LS which is connected in series to a radio frequency resistor R of the diode chip 18 on the equivalent circuit shown in FIG. 6. In the FIG., Cs represents stray capacity between the terminals 20 and 21.

When the PIN diode having the above structure is used for the PIN diodes 12a and 12b in the first embodiment, for one of the PIN diodes 12a and 12b, the stray inductance LS appears on the side of the 4-port coupler 3 as observed from the radio frequency resistor R, and for the other, it appears on the side of the dummy load. This unbalance makes the reflection condition at the port 5 and that at the port 6 unbalance. Consequently, when the stray inductance LS is designed to appear on the same side as observed from the radio frequency resistor R for both of the PIN diodes 12a and 12b as in the second embodiment, the reflection characteristics can be further improved.

c) Third embodiment

Figure 7:
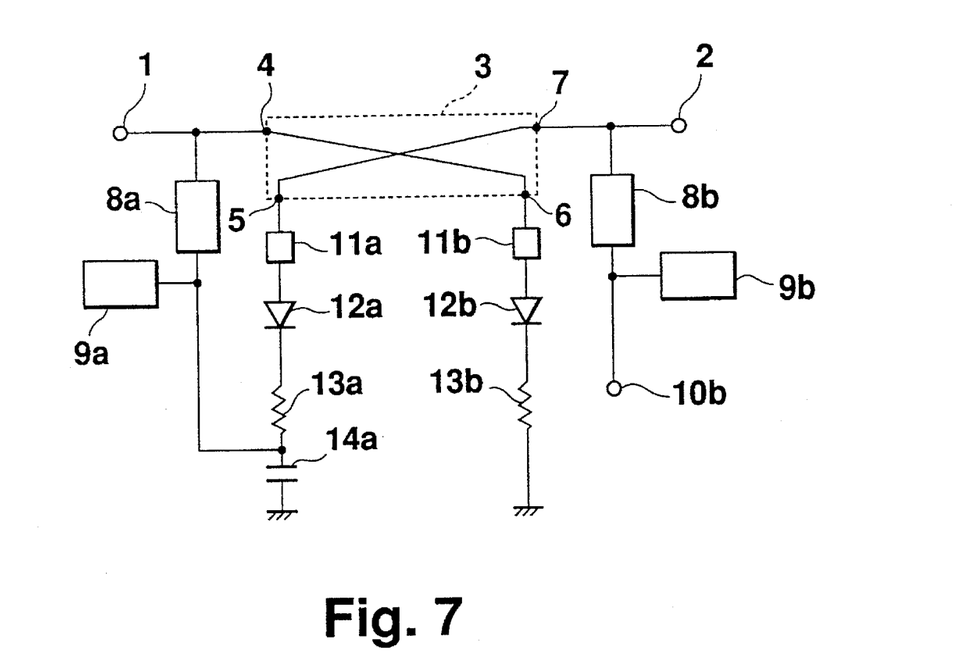
FIG. 7 is a topological sketch of the third embodiment of the invention.

FIG. 7 shows the structure of a variable attenuator according to the third embodiment of the invention. In this embodiment, the PIN diodes 12a and 12b are connected in the same polarity as in the second embodiment. But, the quarter wavelength lines 16a and 16b and the coupling capacitor 17 are not provided, and the connection point of the quarter wavelength line 8a and the quarter wavelength open stub 9a is connected to a connection point of the dummy load 13a and the grounding capacitor 14a.

This embodiment forms one closed d.c. circuit consisting of the bias terminal 10b→the line 8b→the port 7→the port 5→the line 11a→the PIN diode 12a→the dummy load 13a→the line 8a→the port 4→the port 6→the line 11b →the PIN diode 12b→the dummy load 13b→the ground. Since the PIN diodes 12a and 12b are present in the same polarity on this closed circuit, the same current flows through the PIN diodes 12a and 12b, and therefore, they have the same resistance value. Thus, this embodiment provides the appropriately balanced resistance values of the PIN diodes 12a and 12b, makes it possible to accurately control attenuation, and does not raise any problem in reflection properties and others. And, since the PIN diodes 12a and 12b have the same polarity as in the second embodiment, the effects obtained are the same as in the second embodiment.

As compared with the second embodiment, this embodiment has an advantage that the number of component parts is not high. First, this embodiment utilizes a fact that a radio frequency signal is grounded by the grounding capacitor 14a in the termination circuit of the port 5. Specifically, since the impedance of the grounding capacitor 14a which is observed from the connection point of the dummy load 13a and the grounding capacitor 14a is zero in terms of a radio frequency, the connection of the connection point of the dummy load 13a and the grounding capacitor 14a to the signal input terminal 1 makes it unnecessary to provide a means, such as the quarter wavelength line 16a, to increase the apparent impedance of the signal input terminal 1. Second, this embodiment utilizes the fact that a radio frequency signal is grounded by the termination circuit of the port 6. Specifically, since the impedance of the ground which is observed from the dummy load 13b is zero, it is not necessary to provide a means, such as the quarter wavelength line 16b, to increase the apparent impedance of the signal input terminal 2. Furthermore, the coupling capacitor 17 has no need to be provided either.

d) Fourth embodiment

Figure 8:
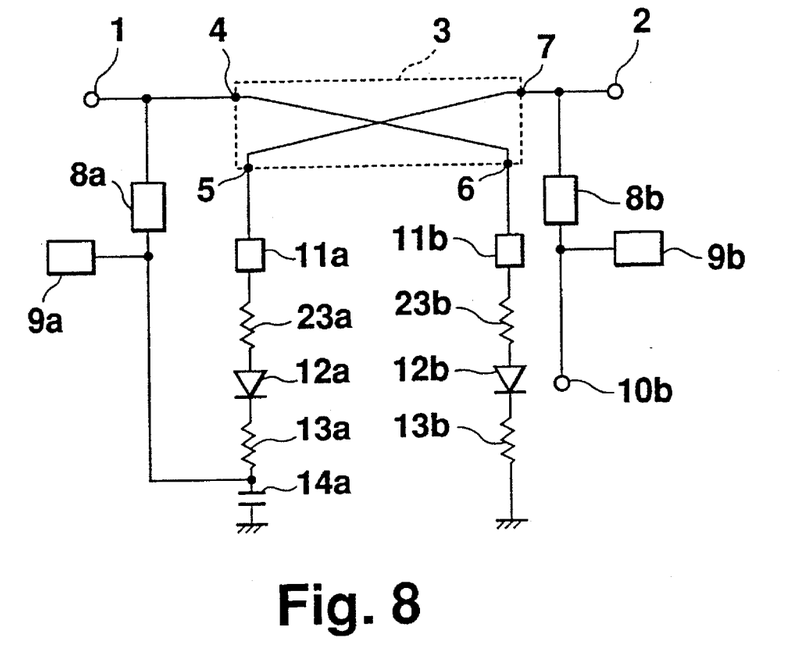
FIG. 8 is a topological sketch of the fourth embodiment of the invention.

FIG. 8 shows the structure of a variable attenuator according to the fourth embodiment of the invention. This embodiment is structured by further adding a dumping resistance 23a to the termination circuit of the port 5 of the third embodiment, and a dumping resistance 23b to the termination circuit of the port 6. The dumping resistances 23a and 23b are disposed on the lines 11a and 11b as observed from the PIN diodes 12a and 12b.

Figure 6:
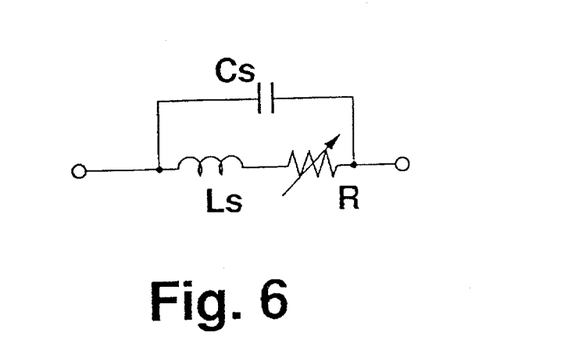
FIG. 6 is a simplified equivalent circuit diagram of the PIN diode shown in FIG. 5.

The dumping resistances 23a and 23b have a function to decrease resonance sharpness Q of the PIN diodes 12a and 12b. When it is assumed that the equivalent circuits of the PIN diodes 12a and 12b are as seen in FIG. 6, the resonance sharpness Q of the PIN diodes 12a and 12b are expressed as follows:

$$Q=\omega Ls/R-1/(\omega CsR).$$

Therefore, when RF resistances R of the PIN diodes 12a and 12b are increased in appearance by the dumping resistances 23a and 24b as in this embodiment, Q is decreased. When Q is decreased, the variable attenuator is hardly affected by resonance. In other words, the characteristics near the resonance frequencies:

$$f=1/\{2\pi(Ls-Cs)\}$$

of the PIN diodes 12a and 12b are improved.

To the dumping resistances 23a and 23b, resistance segments of the dummy loads 13a and 13b may be utilized. Furthermore, the termination impedances in the termination circuits of the ports 5 and 6 are a total of the impedances of the dummy loads 13a and 13b, the RF resistances R of the PIN diodes 12a and 12b, and the dumping resistances 23a and 23b. And, it is to be understood that this embodiment forms the same d.c. circuit as in the third embodiment, and provides the same effects as in the third embodiment. In addition, it is easy to incorporate the characteristics of this embodiment into the second embodiment.

What is claimed is:

1. A variable attenuator comprising:

a multiport coupler having a first port, a second port, a third port, and a fourth port, the second, third, and fourth ports being responsive to the first port so that when a first radio frequency signal is inputted in the first port, a second radio frequency signal being in-phase with the first radio frequency signal appears at the second port, a third radio frequency signal being in 90°—delayed phase with the first radio frequency signal appears at the third port, and a fourth radio frequency signal appears at the fourth port, the fourth radio frequency signal having a first signal portion in 90°—delayed phase with the second radio frequency signal and a second signal portion in opposite phase with the third radio frequency signal;

a single d.c. current path through which a supplied d.c. current flows according to a required attenuation; and first and second variable radio frequency resistive elements which are disposed on said d.c. current path, that make up at least a part of a termination impedance of the second and third ports, respectively, and that produce resistance of a value corresponding to a value of the supplied d.c. current, the fourth port being disposed on said d.c. current path.

2. A variable attenuator comprising:

a multiport coupler having a first port, a second port, a third port, and a fourth port, the second, third, and fourth ports being responsive to the first port so that when a first radio frequency signal is inputted in the first port, a second radio frequency signal being in-phase with the first radio frequency signal appears at the second port, a third radio frequency signal being in 990°—delayed phase with the first radio frequency signal appears at the third port, and a fourth radio frequency signal appears at the fourth port, the fourth radio frequency signal having a first signal portion in 90°—delayed phase with the second radio frequency signal and a second signal portion in opposite phase with the third radio frequency signal;

a single d.c. current path through which a supplied d.c.

current flows according to a required attenuation; and first and second variable radio frequency resistive elements which are disposed on said d.c. current path, that make up at least a part of a termination impedance of the second and third ports, respectively, and that produce resistance of a value corresponding to a value of the supplied d.c. current; wherein the first port is isolated from the second port, and the third port is isolated from the fourth port in terms of direct current, respectively;

said d.c. current path being provided with the following in a direction of said supplied d.c. current, a terminal for supplying the supplied d.c. current, a first circuit for making a d.c. connection of the terminal and the fourth port while isolating the fourth radio frequency signal, the first variable radio frequency resistive element which is coupled to the second port, a second circuit which makes d.c. isolation of the first and second variable radio frequency resistive elements and a ground while making a radio frequency connection, and also makes d.c. connection of the first variable radio frequency resistive element and the second variable radio frequency resistive element while isolating a radio frequency signal, the second variable radio frequency resistive element which is coupled to the third port, and a third circuit for making d.c. connection of the first port and the ground while isolating the first radio frequency signal.

3. The variable attenuator according to claim 2, wherein said first circuit comprises:

a first quarter wavelength line disposed between the terminal and the fourth port, and a second quarter wavelength line with one end open and another end coupled to the terminal.

4. The variable attenuator according to claim 2, wherein said second circuit comprises:

a first grounding capacitor disposed between the first variable radio frequency resistive element and the ground, a second grounding capacitor disposed between the second variable radio frequency resistive element and the ground, and a connection line that couples one end of the first grounding capacitor and one end of the second grounding capacitor.

5. The variable attenuator according to claim 2, wherein said third circuit comprises:

a third quarter wavelength line disposed between the first port and the ground, and a fourth quarter wavelength line with one end open and another end coupled to the third quarter wavelength line.

6. A variable attenuator comprising:

a multiport coupler having a first port, a second port, a third port, and a fourth port, the second, third, and fourth ports being responsive to the first port so that when a first radio frequency signal is inputted in the first port, a second radio frequency signal being in-phase with the first radio frequency signal appears at the second port, a third radio frequency signal being in 90°—delayed phase with the first radio frequency signal appears at the third port, and a fourth radio frequency signal appears at the fourth port, the fourth radio frequency signal having a first signal portion in 90°—delayed phase with the second radio frequency signal and a second signal portion in opposite phase with the third radio frequency signal;

a single d.c. current path through which a supplied d.c. current flows according to a required attenuation; and first and second variable radio frequency resistive elements which are disposed on said d.c. current path, that make up at least a part of a termination impedance of the second and third ports, respectively, and that produce resistance of a value corresponding to a value of the supplied d.c. current; wherein the first port is isolated from the second port, and the third port is isolated from the fourth port in terms of direct current, respectively, said d.c. current path being provided with the following in a direction of said supplied d.c. current:

a terminal for supplying the supplied d.c. current, a first circuit for making a d.c. connection of the terminal and the fourth port while isolating the fourth radio frequency signal, the first variable radio frequency resistive element which is coupled to the second port, a second circuit which makes a radio frequency connection of the first variable radio frequency resistive element and a ground while making d.c. isolation and makes a d.c. connection of the first variable radio frequency resistive element and the first port while isolating the second radio frequency signal, the second variable radio frequency resistive element which is coupled to the third port, and a third circuit for making a d.c. connection of the second variable radio frequency resistive element and the ground while making d.c. isolation of the second variable radio frequency resistive element and the terminal.

7. The variable attenuator according to claim 6, wherein said first circuit comprises:

a first quarter wavelength line disposed between the terminal and the fourth port, and a second quarter wavelength line with one end open and another end coupled to the terminal.

8. The variable attenuator according to claim 6, wherein said second circuit comprises:

a first grounding capacitor disposed between the first variable radio frequency resistive element and the ground, a third quarter wavelength line which is coupled to the first variable radio frequency resistive element, a fourth quarter wavelength line with one end open and another end coupled to the third quarter wavelength line, and a fifth quarter wavelength line disposed between the fourth quarter wavelength line and the first port.

9. The variable attenuator according to claim 6, wherein said third circuit comprises:

a sixth quarter wavelength line which is coupled to the terminal, and a coupling capacitor disposed between the second variable radio frequency resistive element and the sixth quarter wavelength line.

10. The variable attenuator according to claim 6, wherein said first and second variable radio frequency resistive elements are first and second PIN diodes, respectively, and wherein said first and second PIN diodes include stray components which are asymmetrically distributed with respect to an RF resistance.

11. A variable attenuator comprising:

a multiport coupler having a first port, a second port, a third port, and a fourth port, the second, third, and fourth ports being responsive to the first port so that when a first radio frequency signal is inputted in the first port, a second radio frequency signal being in-phase with the first radio frequency signal appears at the second port, a third radio frequency signal being in 90°—delayed phase with the first radio frequency signal appears at the third port, and a fourth radio frequency signal appears at the fourth port, the fourth radio frequency signal having a first signal portion in 90°—delayed phase with the second radio frequency signal and a second signal portion in opposite phase with the third radio frequency signal;

a single d.c. current path through which a supplied d.c. current flows according to a required attenuation; and first and second variable radio frequency resistive elements which are disposed on said d.c. current path, that make up at least a part of a termination impedance of the second and third ports, respectively, and that produce resistance of a value corresponding to a value of the supplied d.c. current; wherein the first port is isolated from the second port, and the third port is isolated from the fourth port in terms of direct current, respectively;

said d.c. current path being provided with the following in a direction of said supplied d.c. current:

a terminal for supplying the supplied d.c. current, a first circuit for making a d.c. connection of the terminal and the fourth port while isolated the fourth radio frequency signal, the first variable radio frequency resistive element which is coupled to the second port, a second circuit which makes a radio frequency connection of the first variable radio frequency resistive element and the ground while making d.c. isolation, and makes a d.c. connection of the first variable radio frequency resistive element and the first port while isolating the second radio frequency signal, and the second variable radio frequency resistive element which is coupled to the third port and a ground.

12. The variable attenuator according to claim 11, wherein said first circuit comprises:

a first quarter wavelength line disposed between the terminal and the fourth port, and a second quarter wavelength line with one end open and another end coupled to the terminal.

13. The variable attenuator according to claim 11, wherein said second circuit comprises:

a first grounding capacitor disposed between the first variable radio frequency resistive element and the ground, a third quarter wavelength line with one end open and another end coupled to one end of the first grounding capacitor, and a fourth quarter wavelength line disposed between the third quarter wavelength line and the first port.

14. The variable attenuator according to claim 11, wherein said d.c. current path is provided with dumping resistances which suppress the resonance sharpness of the first and second variable radio frequency resistive elements.

15. A variable attenuator comprising:

a multiport coupler having a first port, a second port, a third port, and a fourth port, the second, third, and fourth ports being responsive to the first port so that when a first radio frequency signal is inputted in the first port, a second radio frequency signal being in-phase with the first radio frequency signal appears at the second port, a third radio frequency signal being in 90°—delayed phase with the first radio frequency signal appears at the third port, and a fourth radio frequency signal appears at the fourth port, the fourth radio frequency signal having a first signal portion in 90°—delayed phase with the second radio frequency signal and a second signal portion in opposite phase with the third radio frequency signal;

a single d.c. current path through which a supplied d.c. current flows according to a required attenuation; and first and second variable radio frequency resistive elements which are disposed on said d.c. current path, that make up at least a part of a termination impedance of the second and third ports, respectively, and that produce resistance of a value corresponding to a value of the supplied d.c. current; wherein a signal input terminal for inputting an input radio frequency signal to be attenuated, which is coupled to the first port, and a signal output terminal for outputting an attenuated radio frequency signal, which is coupled to the fourth port.

16. A variable attenuator comprising:

a multiport coupler having a first port, a second port, a third port, and a fourth port, the second, third, and fourth ports being responsive to the first port so that when a first radio frequency signal is inputted in the first port, a second radio frequency signal being in-phase with the first radio frequency signal appears at the second port, a third radio frequency signal being in 90°—delayed phase with the first radio frequency signal appears at the third port, and a fourth radio frequency signal appears at the fourth port, the fourth radio frequency signal having a first signal portion in 90°—delayed phase with the second radio frequency signal and a second signal portion in opposite phase with the third radio frequency signal;

a single d.c. current path through which a supplied d,c. current flows according to a required attenuation;

first and second variable radio frequency resistive elements which are disposed on said d.c. current path, that make up at least a part of a termination impedance of the second and third ports, respectively, and that produce resistance of a value corresponding to a value of the supplied d.c. current;

a first termination circuit for terminating the second radio frequency signal appearing at the second port, and including the first variable radio frequency resistive element; and a second termination circuit for terminating the third radio frequency signal appearing at the third port, and including the second variable radio frequency resistive element.

17. The variable attenuator according to claim 16, wherein said first termination circuit includes:

a first line having first and second ends, said first end of the first line being coupled to the second port to transmit the second radio frequency signal appearing at the second port to the second end coupled to a first end of the first variable radio frequency resistive element, and a first dummy load coupled to a second end of the first variable radio frequency resistive element that forms at least a part of of a termination impedance of the second port; and wherein the second termination circuit includes:

a second line having first and second ends, said first end of the second line being coupled to the third port to transmit the third radio frequency signal appearing at the third port to the second end coupled to a first end of the second variable radio frequency resistive element, and a first dummy load coupled to a second end of the second variable radio frequency resistive element that forms at least a part of a termination impedance of the third port.

18. A variable attenuator comprising:

a multiport coupler having a first port, a second port, a third port, and a fourth port, the second, third, and fourth ports being responsive to the first port so that when a first radio frequency signal is inputted in the first port, a second radio frequency signal being in-phase with the first radio frequency signal appears at the second port, a third radio frequency signal being in 90°—delayed phase with the first radio frequency signal appears at the third port, and a fourth radio frequency signal appears at the fourth port, the fourth radio frequency signal having a first signal portion in 90°—delayed phase with the second radio frequency signal and a second signal portion in opposite phase with the third radio frequency signal;

a single d.c. current path through which a supplied d.c. current flows according to a required attenuation; and first and second variable radio frequency resistive elements which are disposed on said d.c. current path, that make up at least a part of a termination impedance of the second and third ports, respectively, and that produce resistance of a value corresponding to a value of the supplied d.c. current, wherein said first and second variable radio frequency resistive elements are first and second PIN diodes, respectively.

19. The variable attenuator according to claim 18, wherein said first and second PIN diodes respectively include stray components which are asymmetrically distributed with respect to an RF resistance.

20. The variable attenuator according to claim 18, wherein said first and second PIN diodes are arranged in a forward bias direction along the d.c. current path.

21. A variable attenuator comprising:

a multiport coupler having a first port for receiving an input signal, a second port, a third port, and a fourth port for outputting an attenuated signal;

a first variable radio frequency resistive element coupled to the second port of the multiport coupler;

a second variable radio frequency resistive element coupled to the third port of the multiport coupler; and a plurality of interconnected circuit elements coupled to the ports of the multiport coupler, and the first and second variable radio frequency resistive elements, to form a d.c. current path that enables a d.c. current to flow through each of the ports of the multiport coupler and the first and second radio frequency resistive elements, the attenuated signal being determined according to the input signal and the d.c. current.

22. The variable attenuator of claim 21, wherein the d.c. current path is formed from the fourth port of the multiport coupler, through each of the first and second variable radio frequency resistive elements, and the first, second, and third ports of the multiport coupler, to a ground.

23. The variable attenuator of claim 22, wherein the d.c. current path passes through the multiport coupler twice.

24. The variable attenuator of claim 22, wherein the multiport coupler is one of a quadrature hybrid coupler and a 3-db range coupler.

25. The variable attenuator of claim 21, wherein the multiport coupler further includes:

a first connection line that couples the first port to the third port so that a d.c. current flowing through the d.c. current path enters the multiport coupler through one of the first and third ports and exits the multiport coupler through the other of the first and third ports; and a second connection line that couples the second port to the fourth port so that the d.c. current enters the multiport coupler through one of the second and fourth ports and exits the multiport coupler through the other of the second and fourth ports.

26. The variable attenuator of claim 25, wherein the first and second variable radio frequency resistive elements include first and second PIN diodes, respectively, the first and second PIN diodes being coupled in series to enable the d.c. current to flow from the second port, through each of the first and second PIN diodes, into the third port.

27. The variable attenuator of claim 25, wherein the first and second variable radio frequency resistive elements include first and second PIN diodes, respectively, the first PIN diode being disposed between the first and second ports to enable the d.c. current to flow from the second port, through the first PIN diode, into the first port, and the second PIN diode being disposed between the third port and a ground to enable the d.c. current to flow from the third port, through the second PIN diode, into the ground.

28. The variable attenuator of claim 27, wherein the plurality of interconnected circuit elements includes:

a first quarter wavelength line having one end coupled to the first port, and another end;

a second quarter wavelength line having one end open, and another end coupled to the another end of the first quarter wavelength line; and a third quarter wavelength line having one end coupled to the another ends of the first and second quarter wavelength lines, and another end coupled to the first radio frequency resistive element.

29. The variable attenuator of claim 27, wherein the plurality of interconnected circuit elements includes:

a first quarter wavelength line having one end coupled to fourth port, and another end;

a second quarter wavelength line having one end open, and another end coupled to the another end of the first quarter wavelength line;

a third quarter wavelength line having one end coupled to the another ends of the first and second quarter wavelength lines, and another end; and a coupling capacitor disposed between the another end of the third quarter wavelength line and the second radio frequency resistive element.

30. The variable attenuator of claim 27, wherein the plurality of interconnected circuit elements includes:
   a first quarter wavelength line having one end coupled to the first port, and another end;
   a second quarter wavelength line having one end open, and another end coupled to the another end of the first quarter wavelength line; and
   a dummy load resistance disposed between the another ends of the first and second quarter wavelength lines and the first radio frequency resistive elements.

31. The variable attenuator of claim 30, wherein the plurality of interconnected circuit elements further includes:
   dumping resistances disposed along the d.c. current path to suppress resonance sharpness of the first and second radio frequency resistive elements.

32. A variable attenuator comprising:
   coupling means for providing coupling between a first port that receives a signal to be attenuated, a second port, a third port, and a fourth port that outputs an attenuated signal;
   first resistance means for providing variable radio frequency resistance to the second port of the coupling means;
   second resistance means for providing variable radio frequency resistance to the third port of the coupling means, wherein the first, second, third, and fourth ports of the coupling means, and the first and second resistance means form a d.c. current path; and
   interconnecting means for interconnecting the ports of the multiport coupler, and the first and second resistance means, to form a d.c. current path that enables a d.c. current to flow through each of the ports of the coupling means and the first and second resistance means, the attenuated signal being determined according to the input signal and the d.c. current.

33. The variable attenuator of claim 32, wherein the d.c. current path is formed from the fourth port of the coupling means, through each of the first and second resistance means, and the first, second, and third ports of the coupling means, to a ground.

34. The variable attenuator of claim 33, wherein the d.c. current path passes through the coupling means twice.

35. The variable attenuator of claim 33, wherein the coupling means is one of a quadrature hybrid coupler and a 3-db range coupler.

36. The variable attenuator of claim 32, wherein coupling means further includes:
   first connecting means for connecting the first port to the third port so that a d.c. current flowing through the d.c. current path enters the coupling means through one of the first and third ports and exits the coupling means through the other of the first and third ports; and
   second connecting means for connecting the second port to the fourth port so that the d.c. current enters the coupling means through one of the second and fourth ports and exits the coupling means through the other of the second and fourth ports.

37. The variable attenuator of claim 36, wherein the first and second resistance means include:
first and second PIN diodes, respectively, the first and second PIN diodes being coupled in series to enable the d.c. current to flow from the second port, through each of the first and second PIN diodes, into the third port.

38. The variable attenuator of claim 36, wherein the first and second resistance means include first and second PIN diodes, respectively,
   the first PIN diode being disposed between the first and second ports to enable the d.c. current to flow from the second port, through the first PIN diode, into the first port, and
   the second PIN diode being disposed between the third port and a ground to enable the d.c. current to flow from the third port, through the second PIN diode, into the ground.

39. The variable attenuator of claim 38, wherein the interconnecting means includes:
   a first quarter Wavelength line having one end coupled to the first port, and another end;
   a second quarter wavelength line having one end open, and another end coupled to the another end of the first quarter wavelength line; and
   a third quarter wavelength line having one end coupled to the another ends of the first and second quarter wavelength lines, and another end coupled to the first PIN diode.

40. The variable attenuator of claim 38, wherein the interconnecting means includes:
   a first quarter wavelength line having one end coupled to fourth port, and another end;
   a second quarter wavelength line having one end open, and another end coupled to the another end of the first quarter wavelength line;
   a third quarter wavelength line having one end coupled to the another ends of the first and second quarter wavelength lines, and another end; and
   capacitance means for providing capacitance between the another end of the third quarter wavelength line and the second PIN diode.

41. The variable attenuator of claim 38, wherein the interconnecting means includes:
   a first quarter wavelength line having one end coupled to the first port, and another end;
   a second quarter wavelength line having one end open, and another end coupled to the another end of the first quarter wavelength line; and
   dummy load resistance means for providing a dummy load resistance between the another ends of the first and second quarter wavelength lines and the first PIN diode.

42. The variable attenuator of claim 41, wherein the interconnecting means further includes:
   dumping resistance means for providing dumping resistances along the d.c. current path to suppress resonance sharpness of the first and second PIN diodes.

* * * * *